United States Patent [19]

Young et al.

[11] Patent Number: 5,294,830
[45] Date of Patent: Mar. 15, 1994

[54] APPARATUS FOR INDIRECT IMPINGEMENT COOLING OF INTEGRATED CIRCUIT CHIPS

[75] Inventors: Steven P. Young, LaGrangeville; John Acocella, Hopewell Junction; Albert J. Fahey, Pleasant Valley; Gaetano P. Messina, Hopewell Junction; Seaho Song, Highland, all of N.Y.

[73] Assignee: International Business Machines Corporation, Armonk, N.Y.

[21] Appl. No.: 703,614

[22] Filed: May 21, 1991

[51] Int. Cl.$^5$ .................. H01L 23/02; H01L 25/04
[52] U.S. Cl. .................. 257/714; 257/718; 257/719; 361/689; 361/699; 165/80.4
[58] Field of Search ............ 357/81, 82; 361/382, 361/385; 257/714, 717, 718, 719; 165/80.4

[56] References Cited

U.S. PATENT DOCUMENTS

| | | | |
|---|---|---|---|
| 4,092,697 | 5/1978 | Spaight | 361/386 |
| 4,153,107 | 5/1979 | Antonetti et al. | 357/81 |
| 4,226,281 | 10/1980 | Chu | 357/81 |
| 4,323,914 | 4/1982 | Berndlmaier et al. | 357/82 |
| 4,381,032 | 4/1983 | Cutchaw | 165/46 |
| 4,531,146 | 7/1985 | Cutchaw | 357/82 |
| 4,561,040 | 12/1985 | Eastman et al. | 361/385 |
| 4,740,866 | 4/1988 | Kajiwara et al. | 357/82 |
| 4,920,574 | 4/1990 | Yamamoto et al. | 361/385 |
| 4,928,207 | 5/1990 | Chrysler et al. | 361/385 |
| 4,977,444 | 12/1990 | Nakajima et al. | 357/82 |
| 4,996,589 | 2/1991 | Kajiwara et al. | 357/82 |
| 5,023,695 | 6/1991 | Umezawa et al. | 357/82 |

OTHER PUBLICATIONS

IBM Technical Disclosure Bulletin: "Mini Conformal Cold Plate"vol. 27, No. 1B, Jun. 1984, pp. 494–495.
IBM Technical Disclosure Bulletin: "New TCM Design Using Bellows"vol. 28, No. 11, Apr. 1986, pp. 4759–4761.
IBM Technical Disclosure Bulletin: "Liquid-Cooled Circuit Package With ... "vol. 29, No. 7, Dec. 1986, p. 2887.
IBM Technical Disclosure Bulletin: "Device Cooling"vol. 20, No. 10, Mar. 1978, p. 3919.
IBM Technical Disclosure Bulletin: "Diaphragm Cooling for Devices"vol. 20, No. 8, Jan. 1978, p. 3121.
Kenneth Mason Publications Ltd., England: "Thermal Conduction Module ... "Research Disclosure, Mar. 1988, #28768.

Primary Examiner—William Mintel
Assistant Examiner—David Ostrowski
Attorney, Agent, or Firm—Aziz M. Ahsan; Peter W. Peterson

[57] ABSTRACT

An integrated circuit thermal conduction module comprises a substrate having a chip-carrying surface and at least one integrated circuit chip on the substrate. A deformable, liquid-impermeable, thermally conductive film or foil extends over an upper surface of the chip. A piston has a lower surface which urges and conforms the film against the chip upper surface and which contains at least one open channel permitting coolant passage and contact with the film for conveying heat from the chip without direct contact between the coolant and chip. Preferably, the piston has a central passageway extending along the longitudinal axis for channeling the coolant through the piston, and has a plurality of channels extending radially outwardly from the central passageway along the lower face for directing coolant beneath the piston.

22 Claims, 4 Drawing Sheets

APPARATUS FOR INDIRECT IMPINGEMENT COOLING OF INTEGRATED CIRCUIT CHIPS

BACKGROUND OF THE INVENTION

This invention relates to an apparatus for cooling integrated circuit chips and, in particular, to a circuit module which utilizes a liquid cooled film to extract heat from the upper surfaces of the chips.

The use of integrated circuit chips has increased dramatically over the years. Although chip size has decreased and power usage is more efficient than in the past, the practice of mounting multiple, closely spaced chips in modules has required that more emphasis be placed on cooling systems to remove the relatively high density power dissipated by the chips. Liquid coolants are commonly employed in high density applications. One problem associated with cooling integrated circuit chips mounted on a substrate is that some of the chips may be tilted or bent and otherwise may have height variations between chips. It is desirable that any cooling system accommodate slightly different chips orientations while providing approximately equal cooling to each chip site.

The prior art has suggested various systems for cooling high powered integrated circuit chips, including those in which multiple chips are arrayed in modules. Previous thermal conductive modules (TCMs) have utilized pistons contained in water cooled housings which contact the chip. Some systems have incorporated water cooled bellows to cool the chip. Such systems are exemplified by IBM Technical Disclosure Bulletin, Vol. 28, No. 11, pp 4759–4761 (April 1986). Another chip cooling arrangement is suggested in IBM Technical Disclosure Bulletin, Vol. 27, No. 1B, pp. 494–495 (June 1984) in which a copper structure having an internal radial water cooling pattern is conformally interfaced using a layer of a metal alloy with a single semi-conductor chip.

Other systems for cooling high powered chips utilize a cooled foil to cover a plurality of chips. One of such systems, disclosed in U.S. Pat. No. 4,381,032, uses a piston to hold the foil against each chip and a liquid coolant which flows around the piston to remove heat conducted through the foil. Another system which utilizes a heat conductive foil over the integrated circuit chips is disclosed in U.S. Pat. No. 4,531,146. IBM Technical Disclosure Bulletin, Vol. 29, No. 7, p. 2887 (December 1986) discloses yet another system which utilizes a metal heat sink carried on a flexible seal for each chip which is spring loaded downwardly against the chip. The upper surface of the heat sink carries fins and is cooled by a jet of coolant.

In a system disclosed in a recent patent issued to the assignee of this application, Chrysler et al. U.S. Pat. No. 4,928,207, the coolant is carried to each chip through the central bore of a piston which is space away from the chip by a spacer having radial vanes. However, this system uses a dielectric coolant which contacts the chips directly and is not suitable with aqueous coolants because of problems of corrosion and short circuiting of the chips.

Although these systems are suitable in many ways, many require their components to be made to high mechanical tolerances and, consequently, are relatively expensive. This is especially true of those systems employing pistons in thermal conduction modules which form part of the path for heat transfer. Furthermore, the power density of multiple chip modules is expected to increase dramatically, particularly as systems approach very large scale integration (VLSI) densities in bipolar technology. This will require even higher thermal conductance between the chip and the coolant, which prior systems may not be able to accommodate. The use of water based coolants is desirable in this regard. Furthermore, it is necessary that the cooling system be reliable, relatively low in cost to manufacture, and easily replaceable in the field.

Bearing in mind the problems and deficiencies in the prior art, and the requirements of new integrated chip technology, it is therefore an object of the present invention to provide a high performance cooling system for integrated circuit chips.

It is another object of the present invention to provide an integrated circuit chip cooling system which utilizes components made to relatively low mechanical tolerances.

It is yet another object of the present invention to provide an integrated circuit chip cooling system which utilizes a water base coolant which does not contact the chips themselves to protect them from corrosion and other problems.

It is a further object of the present invention to provide a cooling system for integrated circuit chips which are tilted, bent, or have chip-to-chip height variations without stressing the connection between the chip and the chip substrate.

It is another object of the present invention to provide a multiple chip cooling system in which equal cooling is provided at each chip site.

It is yet another object of the present invention to provide an integrated circuit chip cooling system which provides a high conductance thermal path between the chip and the coolant.

SUMMARY OF THE INVENTION

The above and other objects, which will be apparent to those skilled in the art, are achieved in the present invention which provides an apparatus for cooling integrated circuit chips which includes a deformable, liquid-impermeable, thermally conductive film for contacting upper surfaces of the chips and a housing over the film forming a water-tight enclosure. An inlet is provided in the housing for a coolant, preferably a water based coolant for maximum heat transfer. At least one piston is disposed within the housing and has a lower face contacting the film at a position over the chips. The piston has at least one channel on the lower face for directing the coolant along the film. An outlet is provided in the housing for removing spent coolant.

In another aspect, the present invention provides an apparatus for cooling a plurality of integrated circuit chips mounted on a substrate comprising a flexible metal foil for contacting the surface of the chips and a housing over the foil forming a water-tight enclosure. An inlet and an outlet are again provided in the housing for a liquid coolant. A plurality of pistons are disposed within the housing, each piston having a lower face contacting the foil at a position corresponding to one of the chips and containing one or more passageways from the inlet to the lower face and plurality of channels on the lower face for flowing the coolant along the foil. There is also provided an independent suspension associated with each piston, preferably a spring, for urging the piston lower face against the foil to conform the foil against the chip surfaces whereby heat may be thermally conducted from the chip to the foil for subsequent removal by the coolant.

In a further aspect, the invention provides a thermal conduction module comprising a substrate having a chip-carrying surface and at least one integrated circuit chip on the substrate. A deformable, liquid-impermeable, thermally conductive film extends over an upper surface of the chip. Preferably, the film used is a metal foil of thickness no greater than about 0.5 mm (0.020 in.). A piston has a lower surface which urges and conforms the film against the chip upper surface and which contains at least one open channel permitting coolant passage and contact with the film for conveying heat from the chip without direct contact between the coolant and chip.

Preferably, the piston is cylindrical, has a central passageway extending along the longitudinal axis for channeling the coolant through the piston, and has a plurality of channels extending radially outwardly from the central passageway along the lower face for directing coolant beneath the piston. Because of its construction, the present invention permits the piston to be made entirely of a non-conductive material with relatively low mechanical tolerances, such as molded plastic. The invention is especially adapted to conform the film against a chip whose upper surface is tilted out of the plane of the substrate.

DETAILED DESCRIPTION OF THE INVENTION

Preferred embodiments of the present invention are depicted in FIGS. 1-6 in which like numerals refer to like features of the invention, but in which features are not necessarily drawn to scale.

Figure 1:
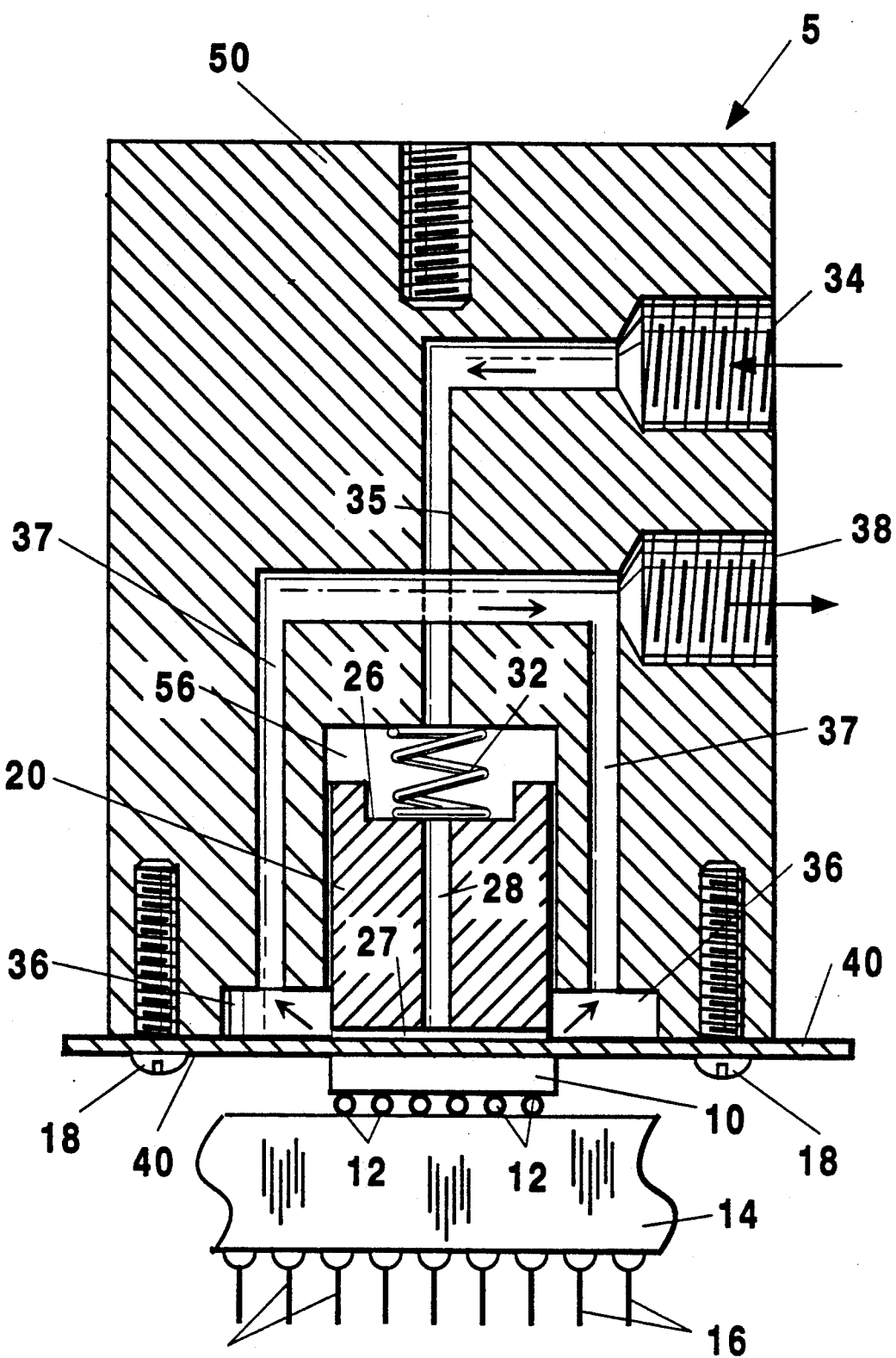
FIG. 1 is a sectional view of a thermal conduction module for a single integrated circuit chip made in accordance with a preferred embodiment of the present invention.

In FIG. 1 there is shown a first embodiment of the invention which comprises a single unit thermal conduction module 5 which contains a single integrated circuit chip or device 10 typically 6.5 mm square mounted on a supporting ceramic substrate 14. Semiconductor chip 10, which has a flat upper surface, is connected to the top of planar substrate 14 by a plurality of connections 12, for example, solder balls. This type of chip connection to the substrate is generally referred to as "flip chip" packaging. The lower surface of substrate 14 contains a plurality of pin connectors 16 that plug into a circuit board (not shown). The substrate 14 can be a single layer or a multilayer substrate. Wiring inside the substrate brings power to the chips and makes signal connections from one chip to another and between the chips and the pins.

Because of the power usage of chips 10, there is normally a substantial excess of heat built up which must be carried away to maintain the chip at the desired temperature range for operation. The chip connectors 12 are limited in cross sectional area and therefore provide little heat conduction away from the chip. To provide effective conduction of heat away from chip 10, the thermal conduction module shown in FIG. 1 includes a deformable, liquid impermeable, thermally conductive film or foil 40 which extends over and contacts the upper surface of the chip. Film 40 is preferably a flexible foil made of a metal such as copper, tin, indium, or the like, and alloys thereof. The foil or film could be a single layer structure or a multilayered structure. The thickness of the foil may vary, but is preferably less than 0.5 mm (0.020 in.), preferably no greater than about 0.25 mm (0.010 in.) and no less than about 0.05 mm (0.002 in.). The foil may be plated on one or both sides with a corrosion resistant coating layer, such as a layer of titanium/nickel clad foil, or gold or other noble metal, to prevent fouling or other corrosion related effects. Film 40 is secured by fasteners 18 to the underside of module cap or housing 50 (also referred to as a "hat") to provide a liquid-tight enclosure for the coolant which passes through the internal structure of the apparatus, as will be described in more detail below.

To hold film 40 firmly in place over the chip and conform it to the chip upper surface for maximum thermal conductivity, there is provided a piston 20 which is slideably disposed within chamber 56 in housing 50. Piston 20 is independently suspended within chamber 56 such that the lower end of piston extends from the open bottom. Compression spring 32 bears against internal piston shoulder 26 to urge the piston downward against the upper surface of film 40 in order to provide close contact between the film and the chip 10. Some spacing is permitted between the walls of piston 20 and piston chamber 56 to allow the piston to cock slightly so that the flat piston lower face 24 may sit squarely against and accommodate tilted or bent chips 10.

Piston 20 may be of any desired configuration and is most preferably in the general shape of a right circular cylinder. However, the piston may have cross sections (as seen in the plane cut normal to the longitudinal axis) other than circular, for example, square, oblong, or obround. The piston preferably has about the same width as the underlying chip, but the piston width may be larger or smaller than the chip width.

Figure 3:
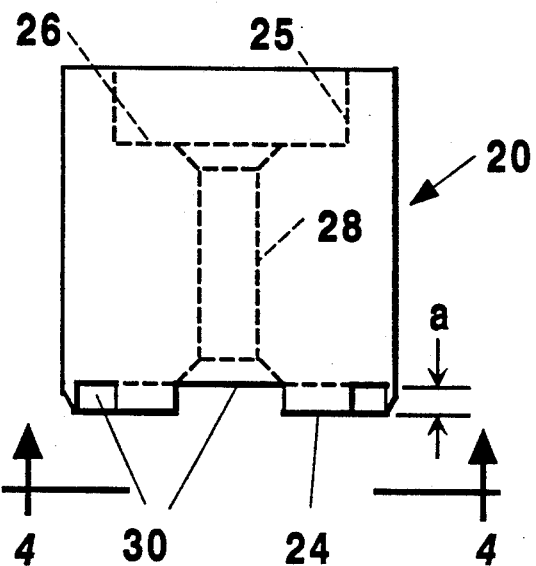
FIG. 3 is a sectional view along the longitudinal axis of one type of piston utilized in the present invention.
Figure 5:
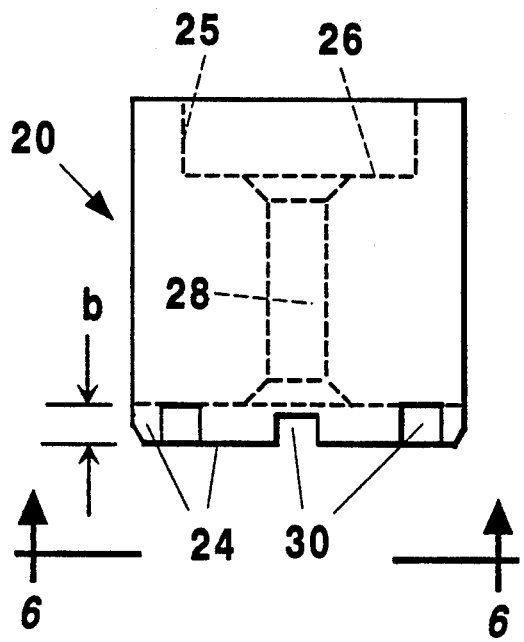
FIG. 5 is a sectional view along the longitudinal axis of another type of piston utilized in the present invention.
Figure 4:
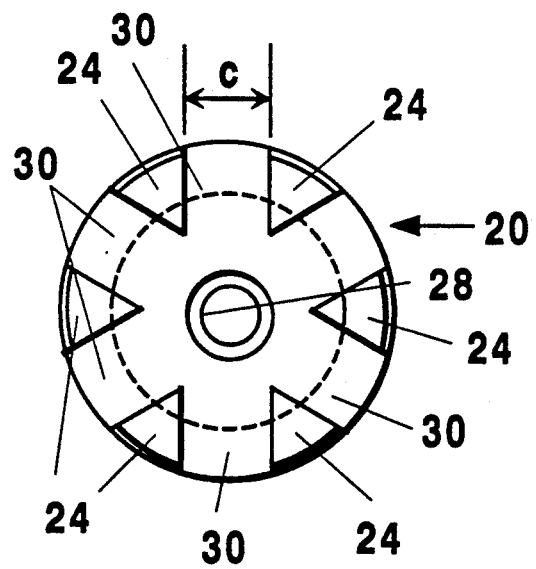
FIG. 4 is an end view of the bottom of the piston depicted in FIG. 3, along line 4—4.
Figure 6:
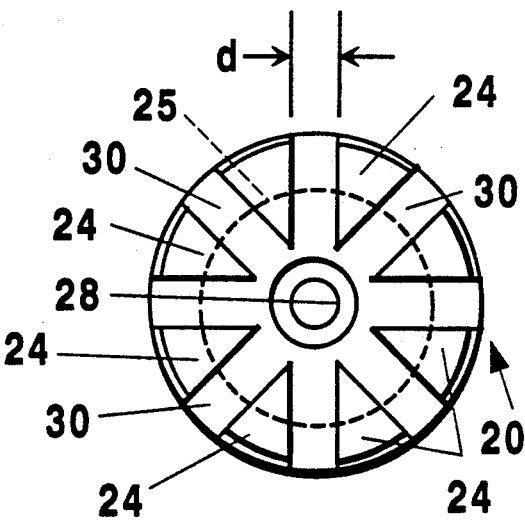
FIG. 6 is an end view of the bottom of the piston depicted in FIG. 5, along line 6—6.

The actual cooling of film 40 is provided by convection via water or other water based coolant which circulates through the module cap 50 above the film. The coolant passes through inlet 34 and inlet channel 35 in the direction shown by the arrow downward into piston chamber 56. As shown in more detail in FIGS. 3 and 4, piston 20 has an opening 25 which narrows down to a central opening or bore 28 which extends through the piston body coaxially with the longitudinal axis of the piston. The coolant travels downwardly through piston bore 28 and impinges on film 40 directly above chip 10. The lower end of bore 28 communicates with a plurality of shallow channels 30 integrally formed or molded in the lower face or surface 24 of piston 20. Channels 30 are open to the lower end of piston and provide passageways for directing the flow of coolant symmetrically radially outward from bore 28 and along the upper surface of film 40. As shown in FIGS. 3 and 4, these channels have a height dimension "a" and a width dimension "c", which results in each channel having a cross sectional area of a×c. These channels may be of other dimensions, for example, they may be deeper and/or narrower as shown in FIGS. 5 and 6 in which channels 30 have a greater height "b" and a narrower width "d". Preferably, the height of each channel is between about 0.025 and 0.130 mm (0.001 and 0.005 in.), inclusive, and the width is between about 1 and 2 mm (0.040 and 0.080 in.), inclusive. A person skilled in the art could easily optimize the height and width of the piston channel 30 to meet specific cooling requirements.

It is important that the lower face 24 of piston 20 have sufficient surface area so that the piston is able to hold and secure film 40 firmly against the upper surface of chip 10. In this regard, it is preferred that the width of each segment of lower piston face 24 along the piston periphery have approximately the same or greater dimension than the width of adjacent channel 30. The piston face segments are preferably substantially wider (relative to the adjacent channels) than the narrow vanes shown in spacers 22 of Chrysler et al. U.S. Pat. No. 4,928,207.

The number of channels employed on the lower face of the piston may be varied according to the amount of heat to be removed from chip 10 through film 40. However, it is preferred that a plurality of channels in the radial pattern depicted in FIGS. 4 and 6 be employed for optimum heat transfer. As the coolant flows through channels 30 between piston 20 and the top surface of film 40, it removes by convective heat transfer the heat which is conducted through film 40 from chip 10. Because of the potentially corrosive properties of the aqueous coolant and the obvious problem of short circuiting of chip 10, it is important that film 40 and its enclosure with module cap 50 be water-tight to prevent leakage of the coolant into the areas directly contacting the chip and it substrate. Below the film, the substrate and chips may be encapsulated in an inert atmosphere, such as helium or nitrogen, or, alternatively, they may be covered with a dielectric fluid such as mineral oil. If oil is used, an aneroid compensator may be required.

Following passage through channels 30, the coolant passes outward from around the base of piston 20 into chamber 36 where it then passes upward through outlet channel 37 between the piston enclosure and cap and thereafter exits the module via coolant outlet 38, as indicated by the arrows.

Unlike many prior art designs, the piston utilized in the present invention does not directly form part of the path of heat transfer, i.e., heat removed from the chip is not substantially conducted through the piston. Instead, the piston has the function of (1) holding the film closely to the chip upper surface for maximum conductive heat transfer from the chip to the film, and (2) providing a predetermined path for passage of liquid coolant over the film and indirect impingement above each chip for maximum convective heat transfer from the film to the coolant. Consequently, unlike those prior art systems in which the piston provides part of the path for conduction of the heat, it is not necessary that the piston of the present invention be made of a thermally conductive material, nor is it necessary that it be made to high mechanical tolerances. As such, pistons used in the present invention may be made entirely out of a nonelectrically conductive material such as plastic which may be injection molded or otherwise formed to the relatively low tolerances typical of these applications.

Figure 2:
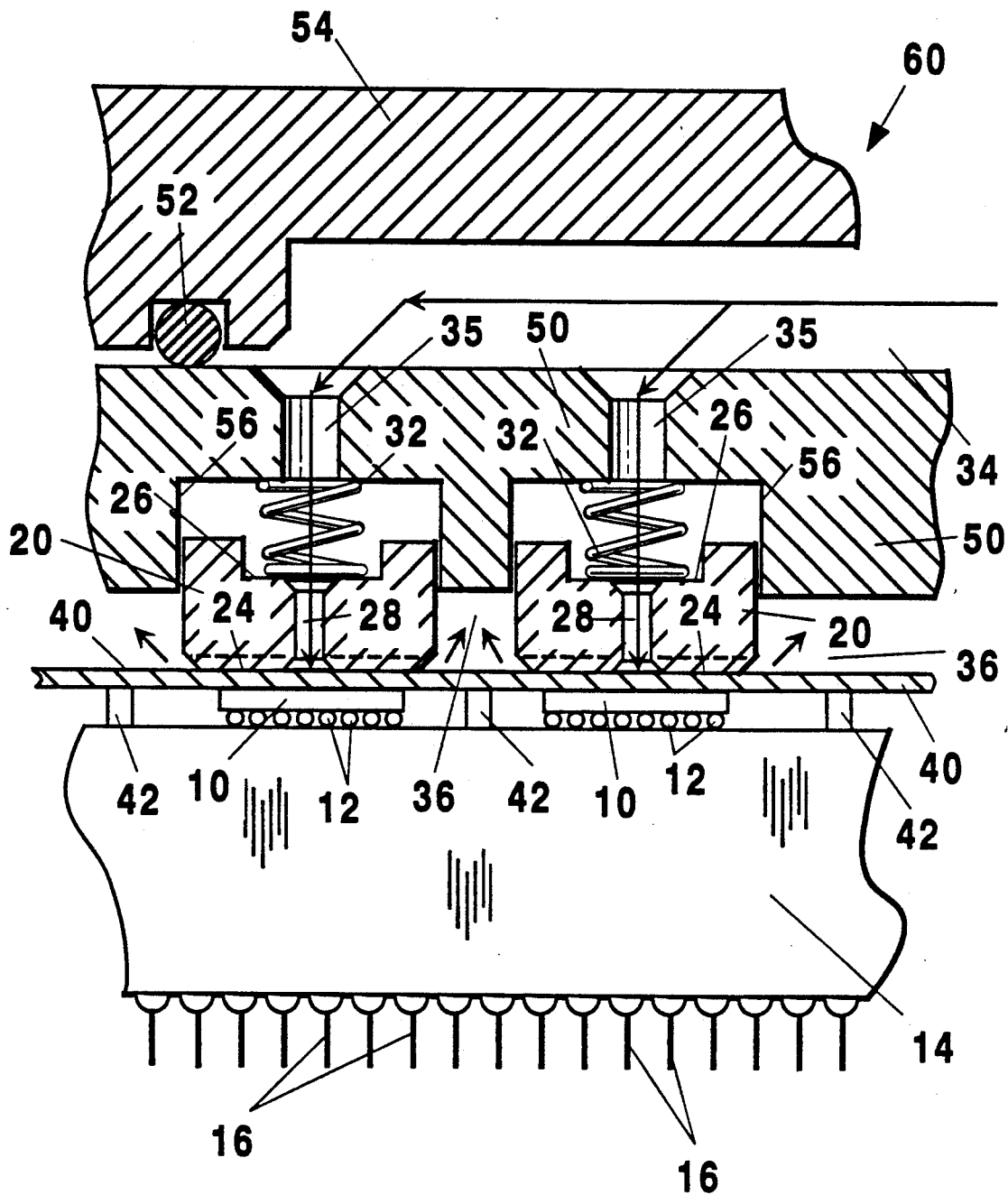
FIG. 2 is a sectional view of another embodiment of the present invention for use with a substrate containing a plurality of integrated circuit chips.

A second embodiment of the invention is depicted in FIG. 2 in which a multiple unit thermal conduction module 60 accommodates a plurality of pistons 20 (two are shown) with each piston being associated with and directly over a separate chip 10, and separated from the chip by only film 40. Because integrated circuit chips may be constructed in modules of 100 or more chips, which may include tilted or bent chips or height variation between adjacent chips, each piston 20 is independently suspended within piston chamber 56 in housing 50 by compression spring 32 so that the single film 40 may be closely conformed to the upper surface of each chip. There may be provided on the chip side of the foil steps 42, such as square steps or other protuberances adjacent each chip to raise the bulk of the foil above the substrate surface. Manifold 54 is sealed over housing 50 by gasket 52, and to film 40 to provide a liquid-tight enclosure for the coolant.

In the embodiment shown in FIG. 2, coolant enters inlet passage 34 in manifold 54 and is distributed through inlet channels 35 down to each individual piston 20. After passage through the central bore 28 of each individual piston, the coolant emerges from piston channels 30 into chamber 36 adjacent the base of the piston and thereafter leaves the module via outlet 38 (not shown).

In thermal conduction modules which contain multiple chips, size and power consumption can differ among the various chips. In such cases, cooling can be customized within the same module to conform cooling characteristics of each piston to the individual chip locations. This may be done, for example, by appropriately varying the piston material selection, the diameter of the piston and its central bore opening, the size and configuration of the channels on the piston lower surface, and other parameters to match the degree of cooling required at the individual chip.

Figure 7:
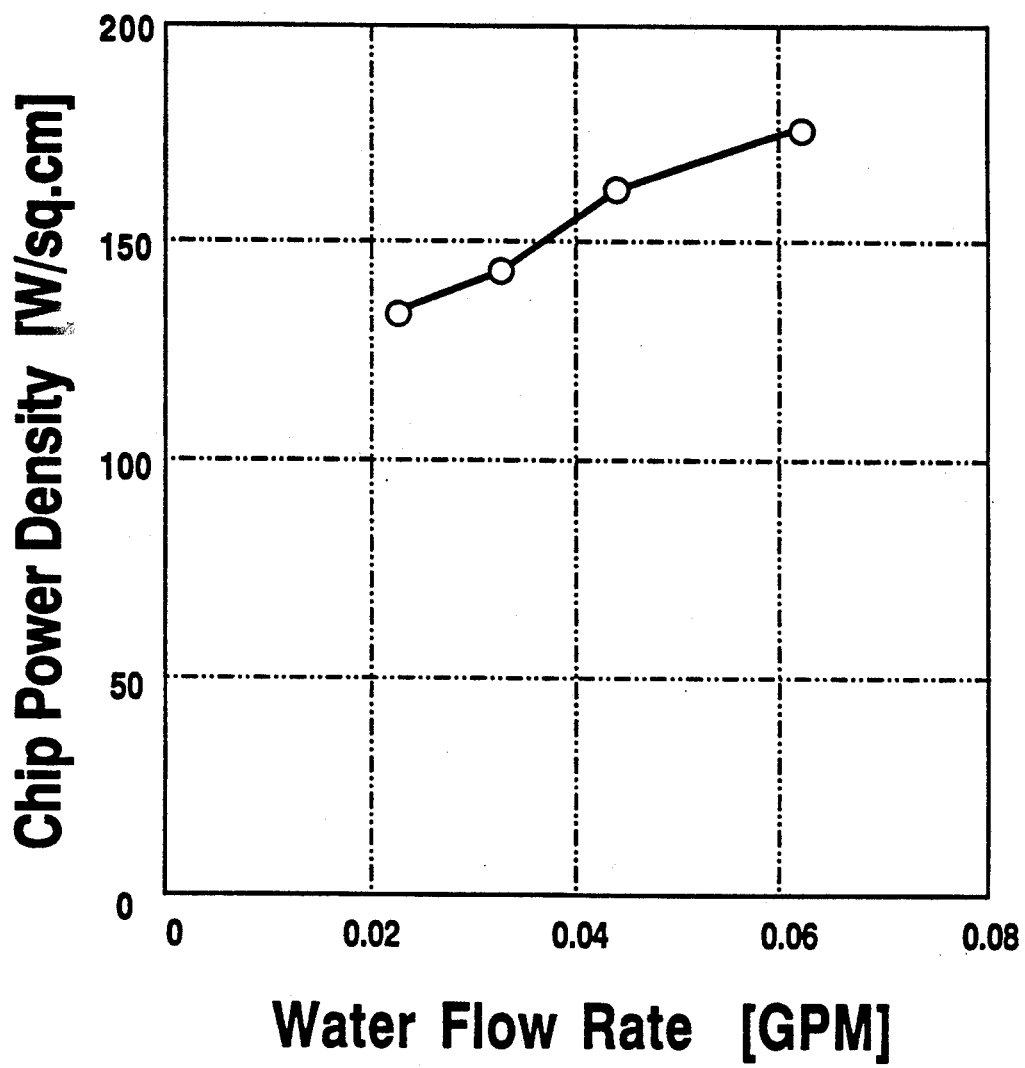
FIG. 7 is a graphical representational of the cooling capacity of one embodiment of the present invention as a function of coolant water flow rate for a single chip.

FIG. 7 depicts the results of tests of a thermal conduction module for a single 6.5 mm × 6.5 mm chip similar to that depicted in FIG. 1. The results indicate a thermal performance, i.e. heat extraction, between about 135 and 180 W/cm$^2$ through a 60° C. temperature differential between the chip and water coolant at a flow rate between about 0.087 and 0.246 l/min. (0.023 and 0.065 gal./min.). For a 100 chip module, the same power density may be easily accommodated by a coolant flow rate between about 8.7 and 24.6 l/min. (2.3 and 6.5 gal./min.). This power density is considerably above the power density of 71 W/cm$^2$ which is presently projected for typical modules, but is likely to be approached with new VLSI chip technology.

Thus, the present invention provides an apparatus for cooling integrated circuit chips which may be easily manufactured but to which uses a high thermal capacity water based coolant in a system which protects the chips themselves from corrosion. Additionally, the present invention provides a system in which equal cooling may be provided at each chip site while accommodating chips which are tilted, bent or have height variations without stressing the connection between the chip and chip substrate.

While this invention has been described with reference to specific embodiments, it will be recognized by those skilled in the art that variations are possible without departing from the spirit and scope of the invention, and that it is intended to cover all changes and modifications of the invention disclosed herein for the purposes of illustration which do not constitute departure from the spirit and scope of the invention.

Having thus described the invention, what is claimed is:

1. A thermal conduction module comprising:
   a substrate having a chip-carrying surface;
   at least one integrated circuit chip on said substrate;
   a deformable, liquid-impermeable, thermally conductive film extending over an upper surface of said chip; and
   a piston having a lower surface for urging said film against said chip upper surface, the piston lower surface containing at least one open channel permitting coolant passage and wherein said coolant contacts said film for conveying heat from said chip without direct contact between said coolant and chip.

2. The thermal conduction module of claim 1 wherein said film comprises a metal foil.

3. The thermal conduction module of claim 1 wherein said piston lower surface contains a plurality of said channels.

4. The thermal conduction module of claim 1 wherein said piston further includes at least one opening through the body of said piston for passage of said coolant to said channel on said piston lower surface.

5. The thermal conduction module of claim 1 wherein said piston further includes a central opening through the body of said piston to said lower surface for passage and impingement of said coolant against said film and wherein said piston lower surface contains a plurality of said channels extending radially outwardly from said central passageway.

6. The thermal conduction module of claim 1 wherein said film comprises a metal foil of thickness less than 0.020 in.

7. The thermal conduction module of claim 1 wherein said module contains a single film covering a plurality of chips mounted on a planar substrate surface, and wherein said module includes an independently suspended piston corresponding to each of said chips, said film and piston being adapted to conform said film against a chip whose upper surface is tilted out of the plane of the substrate.

8. The thermal conduction module of claim 1 wherein said piston is made of a non-electrically conductive material.

9. The thermal conduction module of claim 1 wherein said module contains a plurality of chips having different sizes or power consumption mounted on a substrate surface, and wherein said module includes a plurality of pistons, each piston having cooling characteristics corresponding to each of said chips to match cooling requirements at the individual chip locations.

10. An apparatus for cooling at least one integrated circuit chip mounted on a substrate comprising:
    a flexible metal foil for contacting the surface of said chip;
    a housing over said foil forming a water-tight enclosure;
    an inlet in said housing for a fluid coolant;
    at least one piston disposed within said housing, said at least one piston having a lower face contacting said foil at a position corresponding to said at least one chip, said piston containing a passageway from said inlet to said lower face and plurality of channels on said lower face for flowing said coolant along said foil;
    an outlet in said housing for spent coolant from the piston channels; and
    an independent suspension associated with said at least one piston for urging said piston lower face against said foil to conform said foil against said at least one chip surface whereby heat may be thermally conducted from said chip to said foil for subsequent removal by said coolant.

11. The apparatus of claim 10 wherein said foil has a thickness less than 0.020 in.

12. The apparatus of claim 10 wherein said at least one piston is cylindrical in shape with said passageway along a central bore thereof, and wherein said channels extend radially outwardly from said central bore along the piston lower face.

13. An apparatus for cooling at least one integrated circuit chip comprising:
    a deformable, liquid-impermeable, thermally conductive film for contacting upper surfaces of said chip;
    a housing over said film forming a water-tight enclosure;
    an inlet in said housing for a coolant;
    at least one piston disposed within said housing, said piston having a lower face contacting said film at a position over said chips, said piston having at least one channel on said lower face for directing said coolant along said film; and
    an outlet in said housing for spent coolant.

14. The apparatus of claim 13 wherein said film comprises a metal foil.

15. The apparatus of claim 13 wherein said piston lower face contains a plurality of said channels.

16. The apparatus of claim 13 wherein said piston further includes at least one opening through the body of said piston for passage of said coolant to said channel on said piston lower face.

17. The apparatus of claim 13 wherein said piston further includes a central opening through the body of said piston to said lower face for passage and impingement of said coolant against said film and wherein said piston lower face contains a plurality of said channels extending radially outwardly from said central passageway.

18. The apparatus of claim 13 wherein said film comprises a metal foil of thickness less than 0.020 in.

19. The apparatus of claim 13 further including an independent suspension for said piston for urging said piston lower face against said film to conform said film against said chip surfaces whereby, below the piston, heat may be thermally conducted from said chip to said film for subsequent removal by said coolant.

20. The apparatus of claim 13 wherein said film covers a plurality of chips mounted on a planar substrate surface, and wherein said housing includes an independently suspended piston corresponding to each of said chips, said film and piston being adapted to conform said film against a chip whose upper surface is tilted out of the plane of the substrate.

21. The apparatus of claim 13 wherein said piston is made of a non-electrically conductive material.

22. The apparatus of claim 13 adapted for cooling a plurality of chips having different sizes or power consumption mounted on a substrate surface, said apparatus including a plurality of pistons, each piston having cooling characteristics corresponding to each of said chips to match cooling requirements at the individual chip locations.

* * * * *